(12) United States Patent
Felix et al.

(10) Patent No.: US 11,822,427 B2
(45) Date of Patent: *Nov. 21, 2023

(54) SIGNATURE GENERATION BY A DATA PROCESSING DEVICE

(71) Applicant: Graphcore Limited, Bristol (GB)

(72) Inventors: Stephen Felix, Bristol (GB); Daniel Wilkinson, Bristol (GB); Graham Bernard Cunningham, Chippenham (GB)

(73) Assignee: GRAPHCORE LIMITED, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/823,131

(22) Filed: Aug. 30, 2022

(65) Prior Publication Data

US 2022/0413961 A1    Dec. 29, 2022

Related U.S. Application Data

(63) Continuation of application No. 17/447,954, filed on Sep. 17, 2021, now Pat. No. 11,461,175.

(30) Foreign Application Priority Data

Jun. 25, 2021 (GB) ...................................... 2109198

(51) Int. Cl.
*G06F 11/10* (2006.01)
*G06F 11/07* (2006.01)
*H03K 19/21* (2006.01)

(52) U.S. Cl.
CPC ...... *G06F 11/1068* (2013.01); *G06F 11/0772* (2013.01); *G06F 11/1004* (2013.01); *H03K 19/21* (2013.01)

(58) Field of Classification Search
None
See application file for complete search history.

(56) References Cited

U.S. PATENT DOCUMENTS 7,203,890 B1     4/2007  Normoyle
10,832,639 B2 *  11/2020 Brkic ...................... G09G 5/393
(Continued)

OTHER PUBLICATIONS

B. Wongchaowart, M. K. Iskander and S. Cho, "A content-aware block placement algorithm for reducing PRAM storage bit writes," 2010 IEEE 26th Symposium on Mass Storage Systems and Technologies (MSST), Incline Village, NV, USA, 2010, pp. 1-11, doi: 10.1109/MSST.2010.5496996. (Year: 2010).*

(Continued)

*Primary Examiner* — Daniel F. McMahon
(74) *Attorney, Agent, or Firm* — HAYNES AND BOONE LLP

(57) ABSTRACT

Signature generation circuitry is configured to update a signature in response to each of a plurality of writes to memory. The signature is updated by performing bitwise operations between current bit values of the signature and at least some of the bits written to memory in response a write. The bitwise operation are order-independent such that the resulting signature is the same irrespective of the order in which the writes are used to update the signature. The signatures are formed in an order-independent manner such that, if no errors have occurred in generating the data to be written to be memory, the signatures will match. In this way, a compact signature is developed that is suitable export from the data processing device for checking against a corresponding data processing device of a machine running a duplicate application.

15 Claims, 14 Drawing Sheets

(56) References Cited

U.S. PATENT DOCUMENTS

| | | | | |
|---|---|---|---|---|
| 11,250,891 | B1* | 2/2022 | Golov | G06F 21/602 |
| 2014/0281134 | A1* | 9/2014 | Eitan | G06F 12/0246 |
| | | | | 711/103 |
| 2016/0132374 | A1* | 5/2016 | Mayer | G06F 11/1004 |
| | | | | 714/807 |
| 2017/0169069 | A1* | 6/2017 | Manjunath | G06F 16/2365 |
| 2019/0392060 | A1* | 12/2019 | Meiri | G06F 11/0751 |
| 2020/0081772 | A1 | 3/2020 | Visalli | |
| 2020/0174897 | A1* | 6/2020 | McNamara | G06F 9/5027 |
| 2021/0294511 | A1* | 9/2021 | Beaverson | H04L 9/3247 |
| 2021/0303372 | A1* | 9/2021 | Santoni | G06F 11/1004 |
| 2021/0342492 | A1* | 11/2021 | Volos | G06F 21/64 |

OTHER PUBLICATIONS

Search Report dated Mar. 25, 2022 for United Kingdom Patent Application No. GB2109198.8. 3 pages.

* cited by examiner

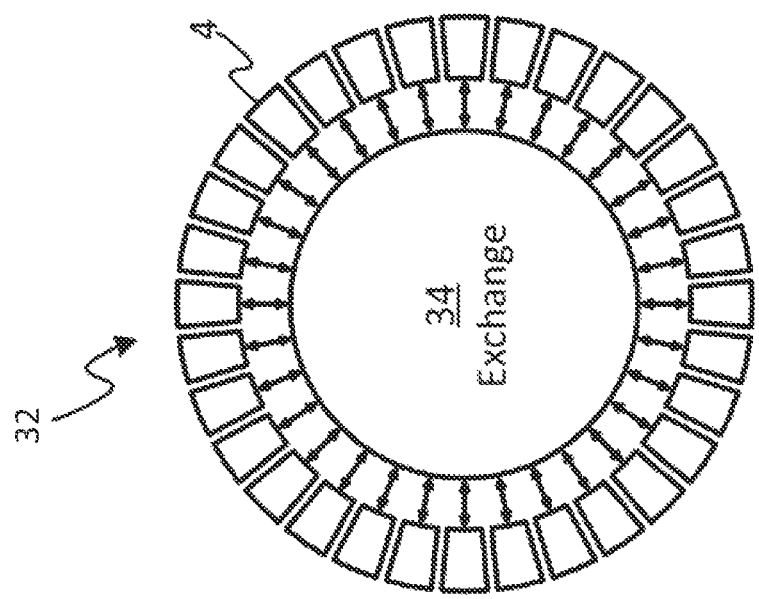
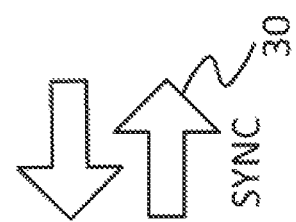
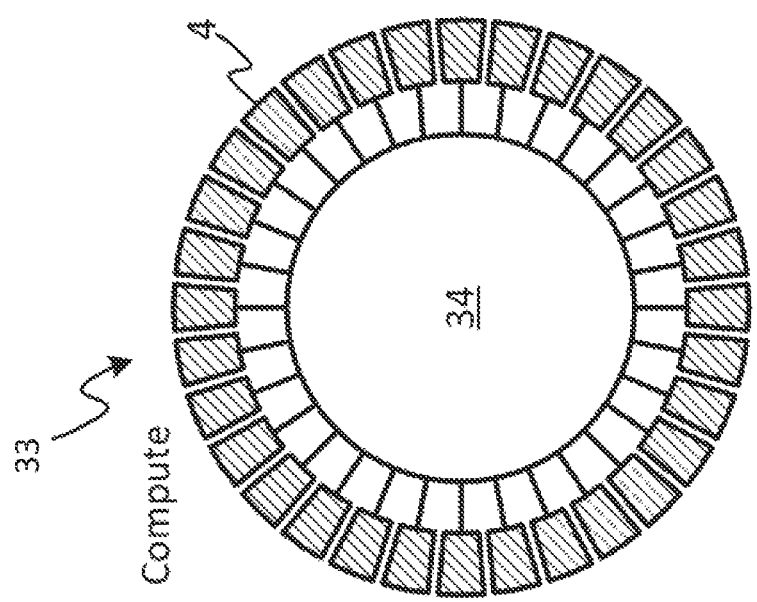
Figure 3

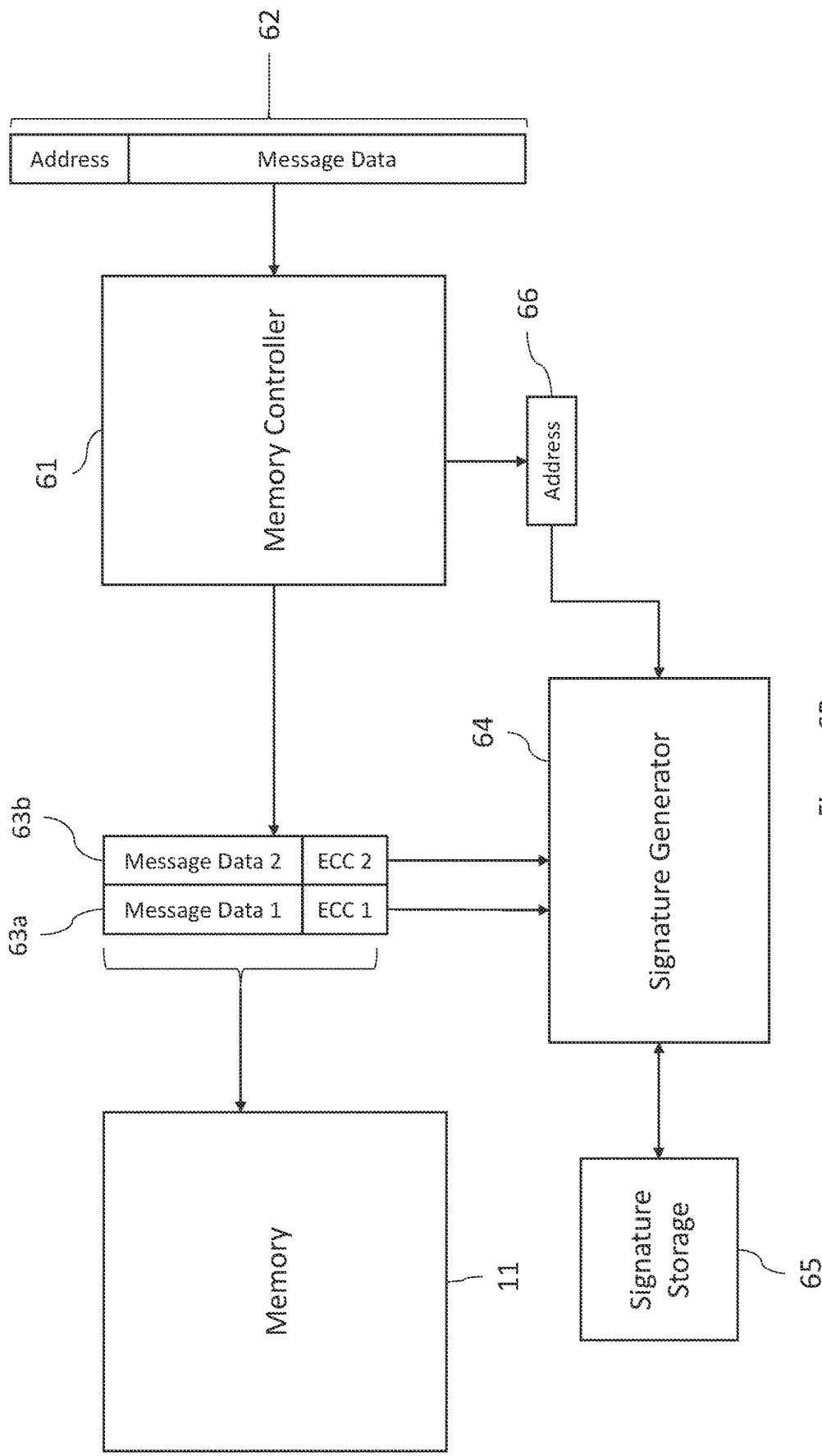

SIGNATURE GENERATION BY A DATA PROCESSING DEVICE

CROSS-REFERENCE TO RELATED APPLICATIONS

The present application is a continuation of U.S. patent application Ser. No. 17/447,954, filed Sep. 17, 2021, which claims priority to United Kingdom Patent Application No. GB2109198.8, filed Jun. 25, 2021, the disclosures of which are hereby incorporated herein by reference in their entireties.

TECHNICAL FIELD

The present disclosure relates to a data processing device, and in particular, to a data processing device in which a data verification signature is generated using data written to memory of the data processing device.

BACKGROUND

When executing an application on a data processing device, there is the possibility that errors can occur during processing. There are two different types of error that commonly occur, these being random errors and hardware errors. Random errors result from ionising radiation that causes the values of bits of data to change. For example, such ionising radiation may cause the value of a bit stored in a memory cell or a register to flip from a '1' to a '0' or vis versa. The ionising radiation may be received from sources external to the device on which processing is performed or may be emitted by the materials used to package electronics. Random errors are rare, but can be problematic, since it is not possible to predict whether a random error will occur in any particular bit of data.

Hardware errors, which are more predictable, could result from numerous different sources. Some examples of sources of hardware errors include: clock signal timing errors, noise on a bus for transporting data, entire regions of the memory module becoming faulty due to aging, dirty connections, and dry soldier joints.

One approach to detected errors is to generate and check error detection codes. An error detection code is calculated by performing certain operations on a set of the data (referred to as message data) to be written to memory. The error detection code is then stored in memory along with the message data in a codeword. The error detection code represents certain redundant information that allows for the detection of one or more errors that may be present in the message data. Some error detection codes are also error correction code (ECCs), which as well as allowing for the detection of one or more errors in the message, may also allow for the correction of one or more errors in the message data.

Since the error detection codes are stored alongside the message data in memory, they are useful for detecting errors that cause the values of memory cells to change. However, error detection codes have limitations in that they may fail to detect all of the errors that occur inside a processing device. For example, an error may occur outside of the memory, in for example an execution unit of the machine. Random errors caused by ionising radiation can cause changes to the values held temporarily in an execution unit. Such errors occurring within the execution unit will go undetected if error detection code is relied upon as the sole means of detecting errors.

SUMMARY

One proposal for detecting errors is to run two copies of the application on separate machines and to periodically compare the results from the two copies to determine if the results from the two copies match. If the results fail to match, this indicates that an error has occurred on at least one of the machines. However, such checking has the potential to introduce large overheads, significantly increasing the time taken to complete processing of the application.

There is, therefore, a need for a technique that would enable a comparison between the results of applications executing on separate machines, whilst minimising the overhead associated with such a comparison.

According to a first aspect, there is provided a data processing device comprising: an execution unit configured to execute computer readable instructions to operate on input values to generate results; a memory for storing at least some of the input values and at least some of the results; signature generation circuitry; a signature storage for storing a signature updated by the signature generation circuitry in response to each of a plurality of writes to the memory; processing circuitry configured to receive the plurality of writes and, for each of the plurality of writes: cause data to be written to the memory; and provide at least some bits of the data to the signature generation circuitry, wherein the signature generation circuitry is configured to, for each of the plurality of writes: generate updated values for bits of the signature by performing operations between current values for the bits of the signature and the at least some of the bits of data to be written to the memory; and overwrite the current values for the bits of the signature held in the signature storage with the updated values for the bits of the signature, wherein the operations are such that a result for the signature after the plurality of writes is independent of the order in which the writes are used to update the signature.

According to embodiments, signature generation circuitry is configured to update a signature in response to each of a plurality of writes to memory. The signature is updated by performing operations using current bit values of the signature and at least some of the bits written to memory in response a write. The operations are order-independent such that the resulting signature is the same irrespective of the order in which the writes are used to update the signature. The signatures are performed in an order-independent manner such that, if no errors have occurred in generating the data to be written to be memory, the signatures will match. In this way, a compact signature is developed that is suitable for export from the data processing device for checking against a corresponding signature generated by a data processing device of a machine running a duplicate application. The compact signature provides for error detection in a manner that avoids the high overheads associated with exporting and checking the entire state of the application.

In some embodiments, the plurality of writes comprise at least one of: a plurality of write requests; and a plurality of read completions.

In some embodiments, the data processing device comprises a memory controller comprising the processing circuitry.

In some embodiments, for each of the plurality of writes, the at least some of the bits of data for the respective write comprises a set of error detection code bits generated for the respective write by the processing circuitry.

In some embodiments, the error detection code bits comprise error correction code.

In some embodiments, the operations are bitwise operations.

In some embodiments, each of the bitwise operations comprises a XOR operation between a bit of the at least some of the bits of data and one of the current values for the bits of the signature.

In some embodiments, the signature generation circuitry is configured to update further bits of the signature using an address in the memory at which the data contained in one of the writes is to be written.

In some embodiments, the signature generation circuitry is configured to update the further bits of the signature by performing bitwise operations between bits of the address and current values for the further bits of the signature.

In some embodiments, each of the bitwise operations comprises a XOR operation between one of the bits of the address and one of the current values for the bits of the signature.

In some embodiments, the data processing device comprises a plurality of processors, wherein each of the processors comprises an instance of the execution unit; an instance of the memory; an instance of the signature generation circuitry; and an instance of the signature storage.

In some embodiments, the memory comprises a plurality of memory banks, wherein the signature generation circuitry is configured to, for each of the plurality of memory banks: update signature bits associated with the respective memory bank in response to each of a plurality of writes to that memory bank, wherein the updating the signature bits associated with the respective memory bank comprises using at least some of the bits of data to be written to that memory bank for the plurality of writes to that memory bank to update signature bits associated with the respective memory bank.

In some embodiments, wherein the data processing device comprises: signature combiner circuitry configured to combine the signature bits for each of the memory banks of the respective processor to generate a signature for the processor, the signature for the processor having fewer bits than a total number of the signature bits for each of the memory banks.

In some embodiments, the execution unit of each of the processor is configured to: upon reaching each of a plurality of predefined points in the computer readable instructions, copy a current value of the signature to a storage external to the processor.

In some embodiments, the plurality of predefined points represent barriers in the computer readable instructions beyond which execution of an application running, at least in part, on the data processing device may not progress until receipt of confirmation that the signature matches a further signature is received at the data processing device.

In some embodiments, the barriers are barrier synchronisations, which represent barriers between a compute phase for the data processing device and an exchange phase for the data processing device.

In some embodiments, at least some of the predefined points are checkpoints, wherein the execution unit is configured to, at a first of the checkpoints, cause checkpoint data to be exported in response to receipt of an indication that the signature matches a further signature generated by a further data processing device of a data processing machine running a duplicate version of the application.

In some embodiments, at least some of the predefined points are checkpoints, wherein the execution unit is configured to, at one of the predefined points, load from external storage, checkpoint data corresponding to a preceding one of the checkpoints in response to receipt of an indication that the signature does not match a further signature generated by a data processing machine running a duplicate version of the application.

In some embodiments, the data processing device is a tile of a multi-tile processing unit.

According to a second aspect, there is provided a data processing system comprising: a first data processing machine comprising the data processing device according to the first aspect; a second data processing machine comprising a further data processing device; and an external device configured to interface with both the first data processing machine and the second data processing machine, wherein the first data processing machine and the second data processing machine are configured to run a same application, wherein the further data processing device is configured to generate a further signature by performing a same set of steps performed by the data processing device of the first data processing machine to generate the signature generated the data processing device of the first data processing machine, wherein the external device is configured to: receive the signature and the further signature; and compare the signature and the further signature to determine if an error has occurred on at least one of the first data processing machine and the second data processing machine.

In some embodiments, the first data processing machine comprises a plurality of instances of the data processing device, and the second data processing machine comprises a plurality of instances of the further data processing device, wherein the external device is configured to compare each of a plurality of signatures generated by the plurality of instances of the data processing device with a corresponding one of a plurality of further signatures generated by the plurality of instances of the further data processing device.

According to a third aspect, there is provided a method comprising: executing computer readable instructions to operate on input values to generate results; storing in memory at least some of the input values and at least some of the results; storing a signature updated in response to each of a plurality of writes to the memory; receive the plurality of writes and, for each of the plurality of writes: cause data to be written to the memory; and generate updated values for bits of the signature by performing operations between current values for the bits of the signature and the at least some of the bits of data to be written to the memory; and overwrite the current values for the bits of the signature held in a signature storage with the updated values for the bits of the signature, wherein the operations are such that a result for the signature after the plurality of writes is independent of the order in which the writes are used to update the signature.

According to a fourth aspect, there is provided a computer program storing computer readable instructions, which when executed by a processor cause a method to be carried out, the method comprising: executing computer readable instructions to operate on input values to generate results; storing in memory at least some of the input values and at least some of the results; storing a signature updated in response to each of a plurality of writes to the memory; receive the plurality of writes and, for each of the plurality of writes: cause data to be written to the memory; and generate updated values for bits of the signature by performing operations between current values for the bits of the signature and the at least some of the bits of data to be written to the memory; and overwrite the current values for the bits of the signature held in a signature storage with the updated values for the bits of the signature, wherein the operations are such that a result for the signature after the plurality of writes is independent of the order in which the writes are used to update the signature.

According to a fifth aspect, there is provided a non-transitory computer readable medium for storing the computer program according to the fourth aspect.

BRIEF DESCRIPTION OF DRAWINGS

To aid understanding of the present disclosure and to show how embodiments may be put into effect, reference is made by way of example to the accompanying drawings in which:

FIG. 3 illustrates the compute and exchange phases between which tiles in the processing unit may alternate;

FIG. 6B illustrates an example of circuitry for maintaining a signature from writes to memory by using error detection code bits to update the signature;

DETAILED DESCRIPTION

Embodiments of the application are implemented in a processor. In some example embodiments described, this processor is one of a plurality of tile processors belonging to a single processing unit.

Figure 1:
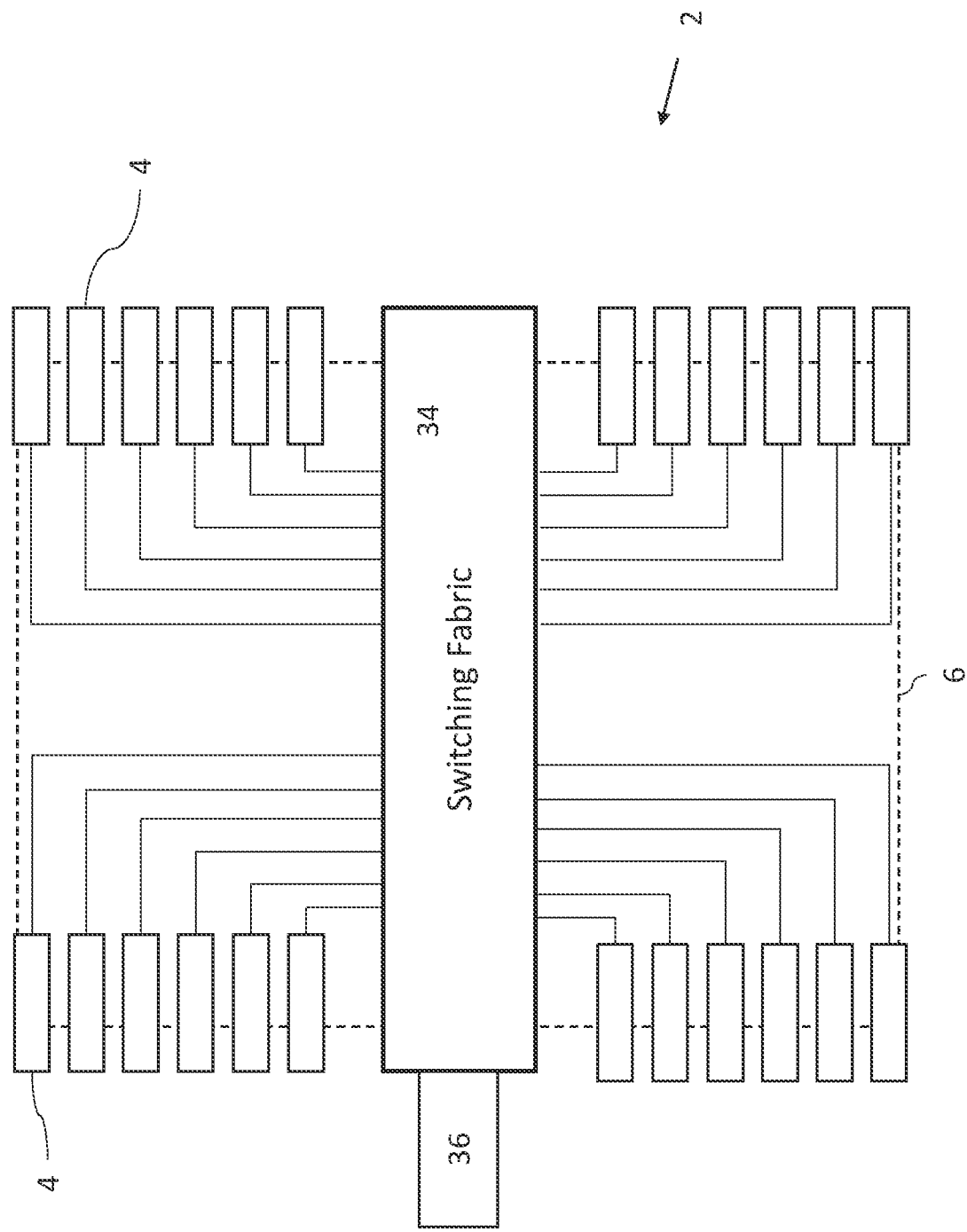
FIG. 1 is a schematic block diagram of a multi-tile processing unit.

Reference is made to FIG. 1, which illustrates an example processing unit 2. This example processing unit 2 is a multi-tile processing unit 2. The processing unit 2 is described in more detail in our earlier U.S. application Ser. No. 15/886,065, the contents of which are incorporated by reference. The processing unit 2 may be an Intelligence Processing Unit (IPU). Each such processing unit 2 is formed on a separate integrated circuit.

The processing unit 2 comprises an array 6 of multiple processor tiles 4 and an interconnect 34 connecting between the tiles 4. The processing unit 2 may be implemented alone as one of multiple dies packaged in the same IC package. The interconnect 34 may also be referred to herein as the "exchange fabric" 34 as it enables the tiles 4 to exchange data with one another. Each tile 4 comprises a respective instance of an execution unit and memory. For instance, by way of illustration, the processing unit 2 may comprise of the order of hundreds of tiles 4, or even over a thousand. For completeness, note also that an "array" as referred to herein does not necessarily imply any particular number of dimensions or physical layout of the tiles 4.

In embodiments, each processing unit 2 is also associated one or more external links, enabling the processing unit 2 to be connected to one or more other processing units (e.g. one or more other instances of the same processing unit 2). These external links may enable the processing unit 2 to be connected to: a host system; and one or more other instances of the processing unit 2 on the same IC package or card, or on different cards. The processing unit 2 receives work from the host, in the form of application data which it processes.

Figure 2:
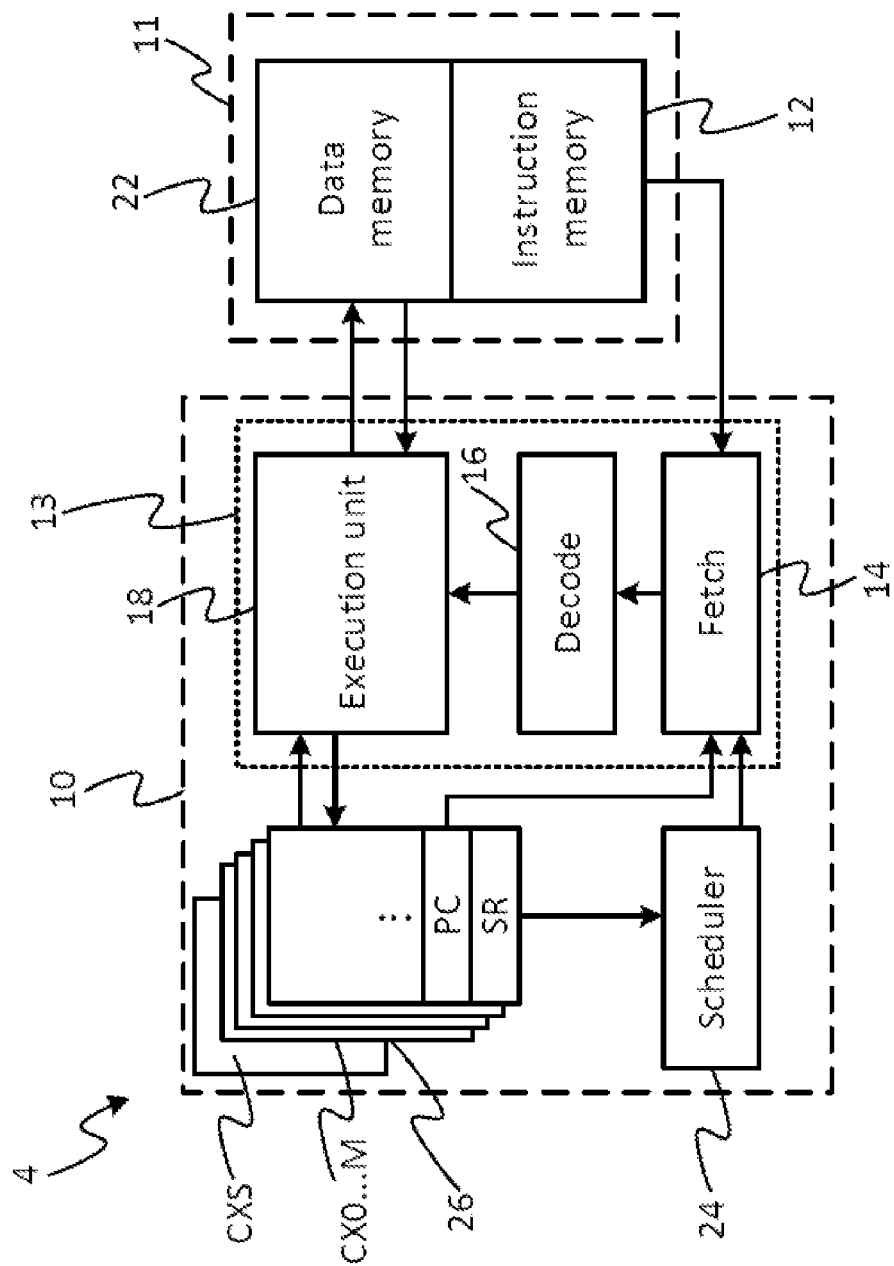
FIG. 2 is a schematic block diagram of one of the tiles that may be implemented in the multi-tile processing unit.

Each of the processor tiles 4 comprises processing circuitry and memory. In some example embodiments, the processing circuitry is a multi-threaded processor 10. FIG. 2 illustrates an example of a processor tile 4 in accordance with embodiments of the present disclosure. The processor tile 4 comprises a multi-threaded processor 10 in the form of a barrel-threaded processor 10, and a local memory 11 (i.e. on the same tile 4 in the case of a multi-tile array, or same chip in the case of a single-processor chip). A barrel-threaded processor 10 is a type of multi-threaded processor 10 in which the execution time of the pipeline is divided into a repeating sequence of interleaved time slots, each of which can be owned by a given thread. This will be discussed in more detail shortly. The memory 11 comprises an instruction memory 12 and a data memory 22 (which may be implemented in different addressable memory unit or different regions of the same addressable memory unit). The memory 11 may be an SRAM memory. The instruction memory 12 stores machine code to be executed by the barrel-threaded processor 10, whilst the data memory 22 stores both data to be operated on by the executed code and data output by the executed code (e.g. as a result of such operations).

The memory 12 stores a variety of different threads of a program, each thread comprising a respective sequence of instructions for performing a certain task or tasks. Note that an instruction as referred to herein means a machine code instruction, i.e. an instance of one of the fundamental instructions of the processor's instruction set, consisting of a single opcode and zero or more operands.

Within the multi-threaded processor 10, multiple different ones of the threads from the instruction memory 12 can be interleaved through a single execution pipeline 13 (though typically only a subset of the total threads stored in the instruction memory can be interleaved at any given point in the overall program). The multi-threaded processor 10 comprises: a plurality of context register files 26 each arranged to represent the state (context) of a different respective one of the threads to be executed concurrently; a shared execution pipeline 13 that is common to the concurrently executed threads; and a scheduler 24 for scheduling the concurrent threads for execution through the shared pipeline in an interleaved manner, preferably in a round robin manner. The multi-threaded processor 10 is connected to a shared instruction memory 12 common to the plurality of threads, and a shared data memory 22 that is again common to the plurality of threads.

The execution pipeline 13 comprises a fetch stage 14, a decode stage 16, and an execution stage 18 comprising an execution unit which may perform arithmetic and logical operations, address calculations, load and store operations, and other operations, as defined by the instruction set architecture. Each of the context register files 26 comprises a respective set of registers for representing the program state of a respective thread.

Referring back to FIG. 1, the interconnect 34 is configured to enable the different tiles 4 in the array 6 to communicate with one another. However, as well as there potentially being dependencies between threads on the same tile 4, there may also exist dependencies between the portions of the program running on different tiles 4 in the array 6. A technique is therefore required to prevent a piece of code on one tile 4 running ahead of data upon which it is dependent being made available by another piece of code on another tile 4. This is achieved using a data consistency model.

Parallel programming models for AI and Data Science usually follows a 3-phase iterative execution model: Compute, Barrier, and Exchange. The implications are that data transfer to and from a processor is usually barrier dependent to provide data-consistency between the processors and between each processor and an external storage. Typically used data consistency models are Bulk Synchronous Parallel (BSP), Stale Synchronous Parallel (SSP) and Asynchronous. The processing unit 2 described herein uses a BSP model, but it will be apparent that the other sync models could be utilised as an alternative.

Figure 4:
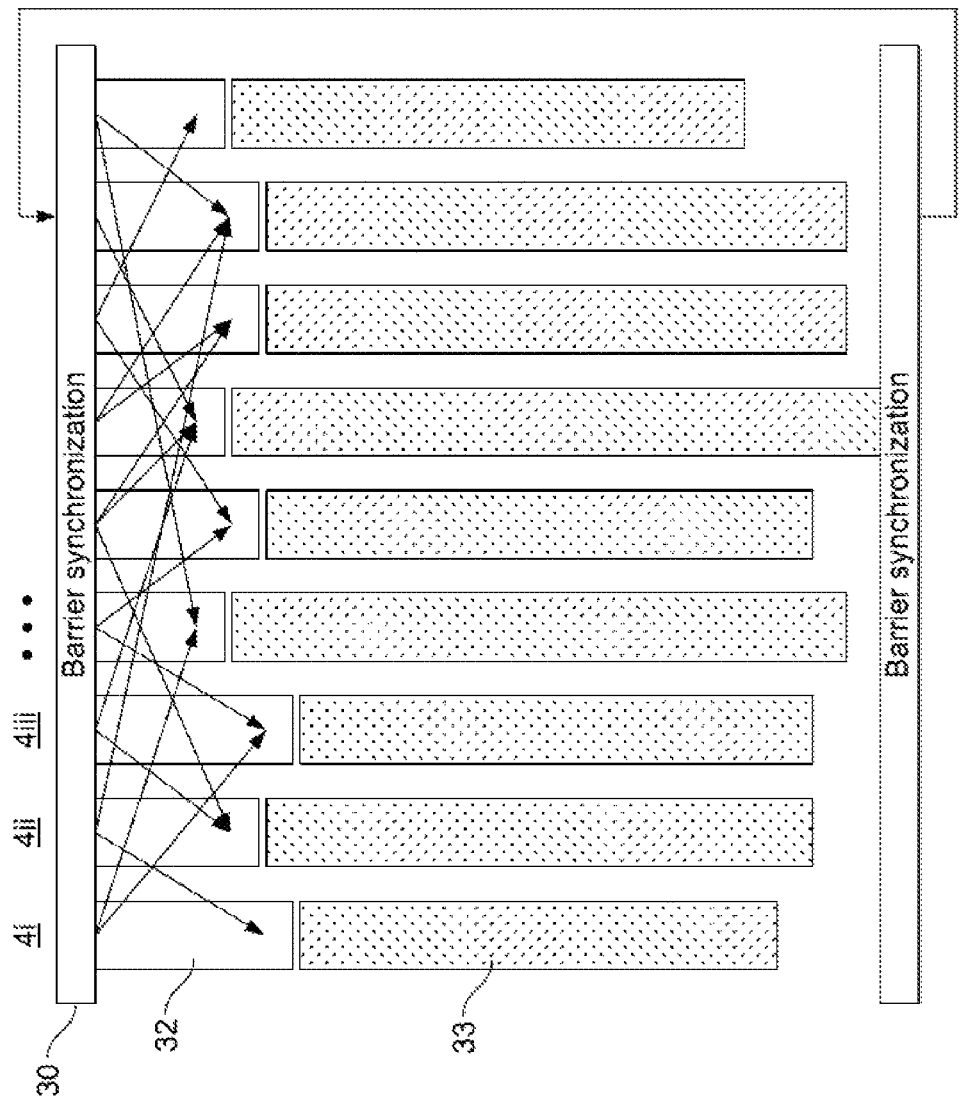
FIG. 4 is a schematic illustration of a bulk synchronous parallel (BSP) computing model.

Reference is made to FIGS. 3 and 4, which illustrate an implementation of a BSP exchange scheme in which each tile 4 performs a compute phase 33 and an exchange phase 32 in an alternating cycle, separated from one to the other by a barrier synchronization 30 between tiles. In the case illustrated by FIGS. 3 and 4, a barrier synchronization is placed between each compute phase 33 and the following exchange phase 32. During the compute phase 33, each tile 4 performs one or more computation tasks locally on-tile, but does not communicate any results of these computations with any others of the tiles 4. In the exchange phase 32, each tile 4 is allowed to exchange one or more results of the computations from the preceding compute phase to and/or from one or more others of the tiles 4, but does not perform any new computations until it has received from other tiles 4 any data on which its task(s) has/have dependency. Neither does it send to any other tile 4, any data except that computed in the preceding compute phase. It is not excluded that other operations such as internal control-related operations may be performed in the exchange phase 32. The communication external to the tile group may optionally utilise the BSP mechanism, but alternatively may not utilize BSP and may instead use some other synchronization mechanism of its own.

According to the BSP principle, a barrier synchronization 30 is placed at the juncture transitioning from the compute phase 33 into the exchange phase 32, or the juncture transitioning from the exchange phase 32 into the compute phase 33, or both. That is to say, either: (a) all tiles 4 are required to complete their respective compute phases 33 before any in the group is allowed to proceed to the next exchange phase 32, or (b) all tiles 4 in the group are required to complete their respective exchange phases 32 before any tile in the group is allowed to proceed to the next compute phase 33, or (c) both of these conditions are enforced. In all three variants, it is the individual tiles 4 which alternate between phases, and the whole assembly which synchronizes. The sequence of exchange and compute phases may then repeat over multiple repetitions. In BSP terminology, each repetition of exchange phase and compute phase is sometimes referred to as a "superstep" (though note that in the literature the terminology is not always used consistently: sometimes each individual exchange phase and compute phase individually is called a superstep, whereas elsewhere, as in the terminology adopted herein, the exchange and compute phases together are referred to as a superstep).

Note also, it is not excluded that multiple different independent groups of tiles 4 on the same processing unit 2 or different processing units could each form a separate respective BSP group operating asynchronously with respect to one another, with the BSP cycle of compute, synchronize and exchange being imposed only within each given group, but each group doing so independently of the other groups. I.e. a multi-tile array 6 might include multiple internally synchronous groups each operating independently and asynchronously to the other such groups (discussed in more detail later). In some embodiments there is a hierarchical grouping of sync and exchange, as will be discussed in more detail later.

FIG. 4 illustrates the BSP principle as implemented amongst a group 4i, 4ii, 4iii of some or all of the tiles in the array 6, in the case which imposes: (a) a barrier synchronization from compute phase 33 to exchange phase 32 (see above). Note that, in this arrangement, some tiles 4 are allowed to begin computing 33 whilst some others are still exchanging.

The BSP model is used for exchange of data between tiles 4 on the processing unit 2. The communication between tiles 4 of a processing unit 2 occurs in time deterministic fashion in which data packets are transmitted without headers as in our earlier application U.S. patent application Ser. No. 15/886,315. Additionally, the BSP model may also be used for the exchange of data between processing units 2.

Figure 5:
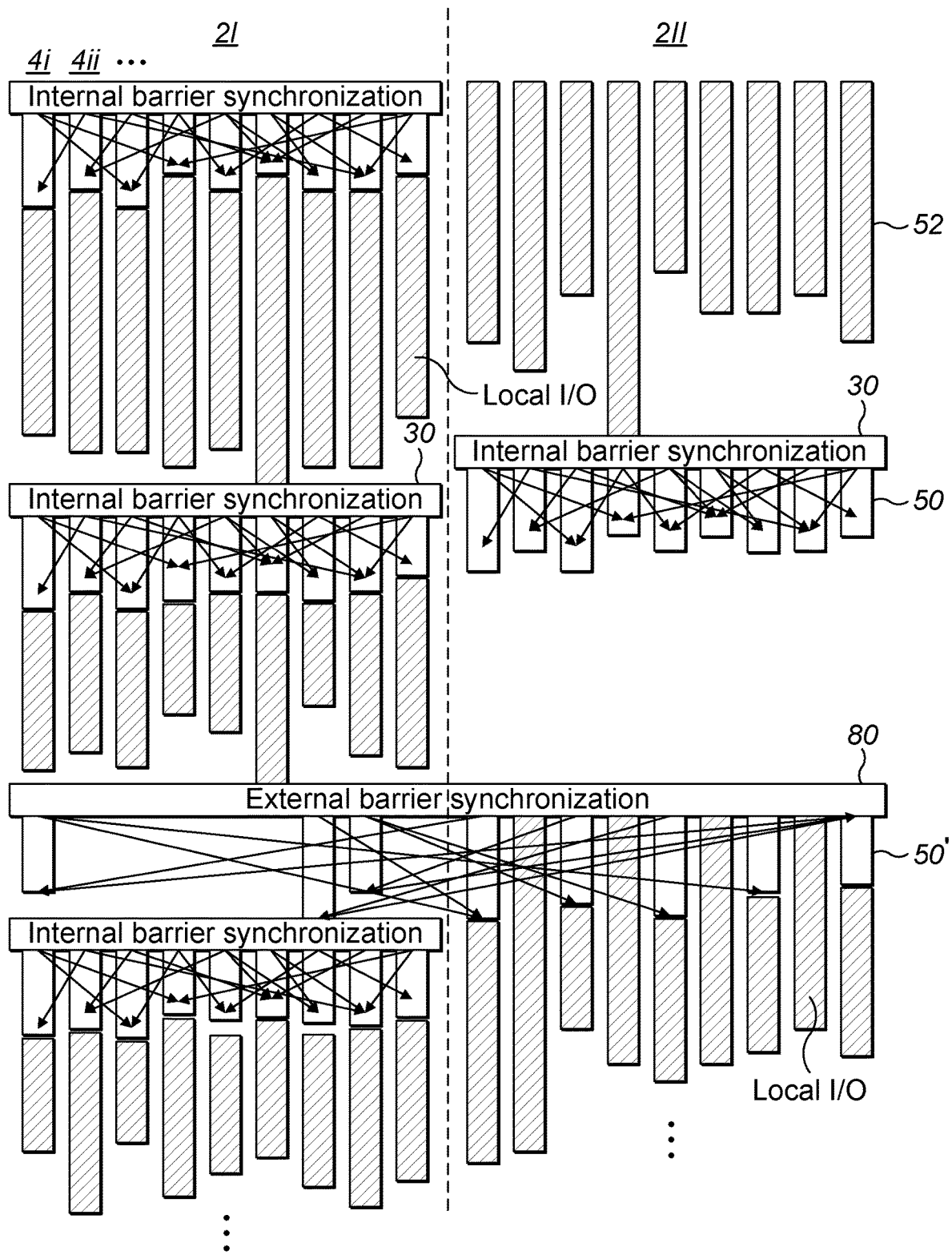
FIG. 5 illustrates a bulk synchronous parallel (BSP) computing model.

Reference is made to FIG. 5 illustrates an example BSP program flow involving both internal (on-chip) and external (inter-chip) synchronizations. As shown, the flow comprises internal exchanges 50 (of data between tiles 4 on the same chip 2) and an external exchange 50' (of data between tiles 4 on different chips 2). The program flow in FIG. 5 illustrates a program flow for a first processing unit 2i and a second processing unit 2ii.

As illustrated in FIG. 5, the internal BSP supersteps (comprising the internal exchanges 50 of data between tiles 4 on the same chip 2) are kept separate from the external sync and exchange (comprising the external exchanges 50' of data between tiles 4 on different chips 2).

The program may be arranged to perform a sequence of synchronizations, exchange phases and compute phases comprising, in the following order: (i) a first compute phase, then (ii) an internal barrier synchronization 30, then (iii) an internal exchange phase 50, then (iv) an external barrier synchronization 80, then (v) an external exchange phase 50'. The external barrier 80 is imposed after the internal exchange phase 50, such that the program only proceeds to the external exchange 50' after the internal exchange 50. Note also that, as shown with respect to chip 21 in FIG. 5, optionally a compute phase may be included between internal exchange (iii) and external barrier (iv).

This overall sequence is enforced by the program (e.g. being generated as such by the compiler). In embodiments, the program is programmed to act in this way by means of a SYNC instruction executed by the tiles 4. The internal synchronization and exchange does not extend to any tiles or other entities on another chip 2. The sequence (i)-(v) (with the aforementioned optional compute phase between iii and iv) may be repeated in a series of overall iterations. Per iteration there may be multiple instances of the internal compute, sync and exchange (i)-(iii) prior to the external sync & exchange. I.e. multiple instances of (i)-(iii) (retaining that order), i.e. multiple internal BSP supersteps, may be implemented before (iv)-(v), i.e. the external sync and exchange. Note also, any of the tiles 4 may each be performing their own instance of the internal synchronization and exchange (ii)-(iii) in parallel with the other tiles 4.

Thus per overall BSP cycle (i)-(v) there is at least one part of the cycle (ii)-(iii) wherein synchronization is constrained to being performed only internally, i.e. only on-chip.

Note that during an external exchange 50 the communications are not limited to being only external: some tiles may just perform internal exchanges, some may only perform external exchanges, and some may perform a mix.

Also, as shown in FIG. 5, some tiles 4 may perform local input/output during a compute phase. For example, they may exchange data with a host or other type of external storage.

Note also that, as shown in FIG. 5, it is in general possible for any or all tiles to have a null compute phase 52 or a null exchange phase 50 in any given BSP superstep.

Each of the synchronisation barriers shown in FIG. 5 is passed by the tiles 4 once an exchange of transmission of sync requests and acknowledgments has completed. For an internal barrier synchronisation, each tile 4 in a processing unit 2, once it reaches an internal barrier synchronisation, sends an internal sync request to the internal synchronisation controller 36 in the interconnect 34. When the internal synchronisation controller 36 has received sync requests from all of the tiles 4 that are part of the processing unit 2, the sync controller 36 returns sync acknowledgments to each of the tiles 4. Upon receiving the sync acknowledgments, each of the tiles 4 then enters the exchange phase in which data exchange between the tiles 4 occurs. This technique ensures the each tile 4 must reach the barrier before any of the tiles can progress to the exchange phase.

For an external barrier synchronisation, the exchange of sync requests and acknowledgments takes place between a group of processing units 2, referred to as a synchronisation group. Following the exchange of sync requests and acknowledgments, the processing units 2 exchange data during an exchange phase.

Each of the tiles 4 on the processing unit 2, once it reaches the external synchronisation barrier, issues an external sync request to external sync logic (not shown in FIG. 1) that is associated with the processing unit 2. Once the external sync logic has received a sync request from all of the tiles 4 on the processing unit 2, it either acknowledges those sync requests or propagates a sync request to a further entity that is part of the sync group. The further entity could be a proxy for exchanging data with a host system or external sync logic associated with another processing unit 2.

When a sync request is propagated to external sync logic associated with another processing unit 2, the action taken by the external sync logic in that other processing unit 2 in response to the sync request depends upon whether the logic is defined as the master for the sync group or as a propagation node for that group. The propagation nodes propagate their received sync requests towards the master defined for the sync group. The sync master, once it has received external sync requests for each of the processing units 2 that are part of the sync group, returns sync acknowledgments to the external sync logic associated with each of the other processing units 2 in the sync group. The sync master also returns sync acknowledgments to each of the tiles 4 in its own processing unit 2. Each external sync logic (i.e. the propagation nodes) of the other processing unit 2 in the sync group, upon receiving a sync acknowledgment, returns sync acknowledgments to the tiles 4 of its processing unit 2. In response to receiving the sync acknowledgements, the tiles 4 pass the barrier synchronisation and exchange data with the other processing units 2 of the sync group during the exchange phase.

According to embodiments of the application, a data processing device is provided with signature generation circuitry for maintaining a signature generated in dependence upon writes to tile memory. This signature provides for a low overhead way of checking that data generated and written to memory across different machines is the same and that no errors have occurred. The signature is overwritten in response to each write to memory and is therefore compact and low overhead.

Figure 6A:
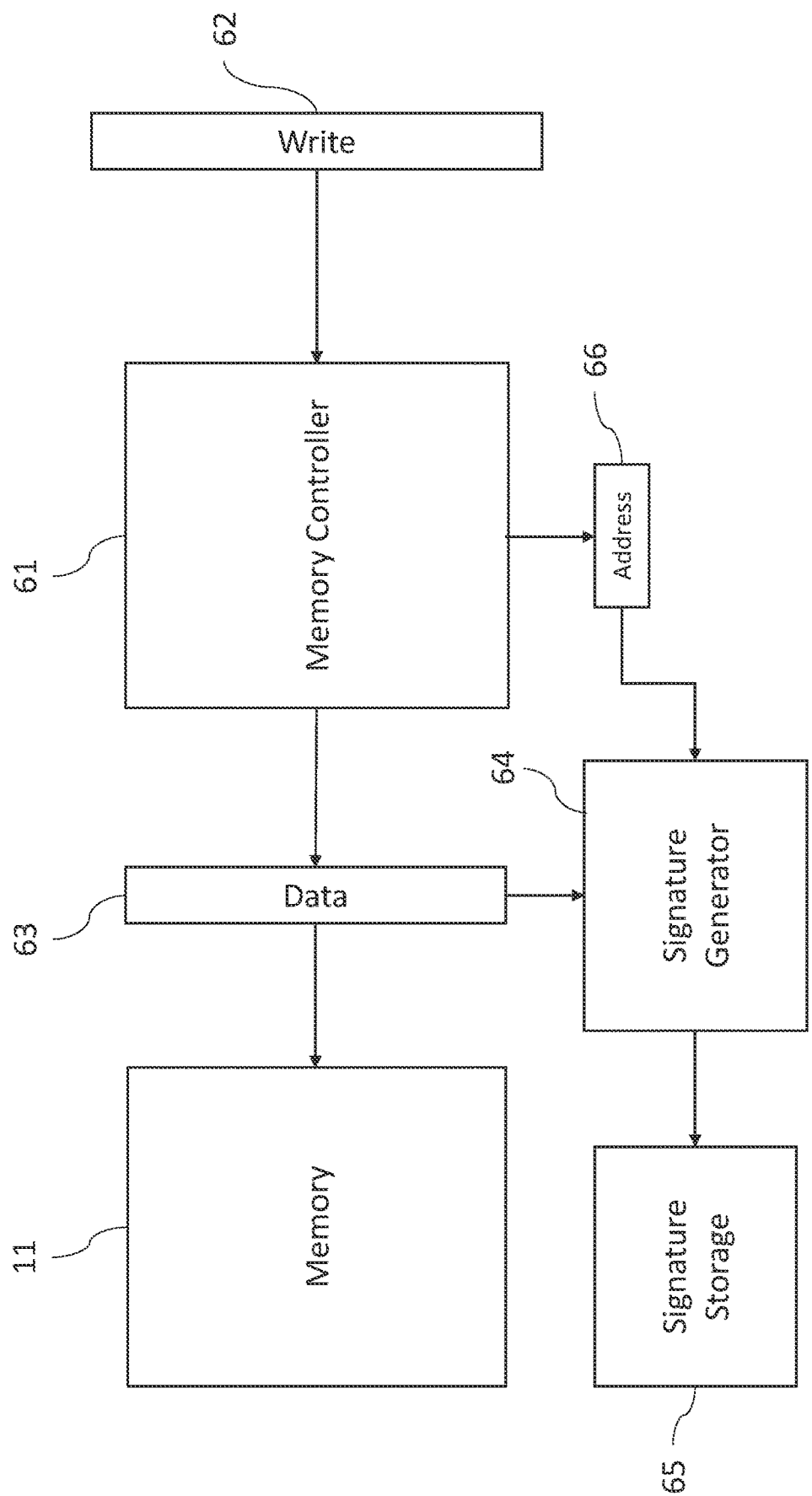
FIG. 6A illustrates an example of circuitry for maintaining a signature from writes to memory

Reference is made to FIG. 6A, which illustrates an example of circuitry that is part of the data processing device for generating the signature as discussed. The data processing device that includes the components shown in FIG. 6A may be the tile 4 that has been discussed. FIG. 6A shows the memory 11, into which data may be written, and from which data may be read. The data read from and written into the memory 11 may include application data, which is processed by, or constitutes the results of processing by, instructions held in the instruction memory 12. The application data is held in the data memory 22 part of the memory 11. The data read from and written into the memory 11 also includes instructions, which are retrieved from the memory 11 for execution by the execution unit 18 of the tile processor 4. The instructions are held in the instruction memory 12 part of the memory 11.

A memory controller 61 is provided in the tile processor 4. The memory controller 61 is configured to write data to the memory 11 and read data from the memory 11. The memory controller 61 receives writes to write data to the memory 11 at addresses indicated in each write. Writes may be received at the memory controller 61 from the execution unit 18 or may be received from an entity external to the tile 4, e.g. another tile 4 of the same processing unit 2 or a tile 4 on a different processing unit 2. The memory controller 61 also receives read requests to read data from the memory 11 at an address indicated in the read request.

FIG. 6A shows an example of a write 62 received at the memory controller 61. The write 62 comprises an address field and a set of message data to be written to a location in memory 11 indicated in the address field. In some embodiments, the address field is 16 bits, and the message data is 64 bits in size. The write 62 may be the result of a write request or a read completion received at the tile 4 from an external processor, e.g. another tile 4 or an external storage. Alternatively, the write 62 may contain data generated during processing by the execution unit 18.

When it receives a write 62, the memory controller 61 causes data 63 generated in response to the write 62 to be written to the memory 11. The data 63 written to the memory 11 includes data from the write 62. The data 63 may also includes error detection code generated by the memory controller 61 in dependence upon data (referred to as message data) extracted from the write 62. Together, the error detection code and the message data form a codeword that is written to the memory 11.

At least part of the data 63 written to the memory 11 is provided from the memory controller 61 to a signature generator 64 of the tile 4. The at least part of the data 63 provided to the signature generator 64 may be message data from the write 62. Alternatively, the at least part of the data 63 provided to the signature generator 64 may be error detection code associated with the message data.

The signature 63 generate performs operations to update a current value of a signature held in signature storage 65 of the tile 4. The signature storage 65 is a register holding the current value of the signature at all times. When the application is started, the signature storage 65 may be initialised to hold a predefined pattern (e.g. all zeros) before it is updated as the application executes and data is written to memory 11. The operations to update the signature comprise bitwise operations between the at least part of the data 63 provided by the memory controller 61 and bits of the current value of the signature. The operations are used to update the signature held in the storage 65 by overwriting the bits of the current value of the signature with the result of the bitwise operations.

The signature generator 64 updates the signature in an order independent manner. In other words, the order in which writes are received at the memory controller 61 and, therefore, the order in which the different writes are used to update the signature does not affect the final value of the signature. For example, if the signature generator 64 receives a first set of data derived from a first write and uses this to update the signature, followed by receiving a second set of data derived from a second write and uses this to update the signature, the resulting signature is the same as the signature that would result from first receiving the second set of data and updating the signature, followed by receiving the first set of data and updating the signature.

In some embodiments, in addition to bits that are updated using error detection code bits, the signature may also include bits that are updated using the bits of the address of a write. As shown in FIG. 6B, the memory controller 61 provides the address 66 in memory 11, to which data of write 62 is to be written, to the signature generator 64.

The signature generator 64 uses the address 66 to update bits of the signature held in the signature storage 65. The bits of the signature updated using the bits of the data 63 written to memory 11 are referred to herein as the "Data signature". The bits of the signature updated using the address bits are referred to herein as the "Index Signature".

As with the bits of the data signature, the bits of the index signature are updated in an order independent manner. In other words, the order in which writes are received at the memory controller 61 and, therefore, the order in which the different address fields are used to update the signature does not affect the final value of the signature.

The use of the address bits for updating the signature is useful for ensuring that the same data in different machines is written to the same memory locations. If the index signatures match, this verifies that the data from writes was stored to the same locations in memory across the machines.

As noted, in some embodiments the message data bits derived from the write 62 may be used by the signature generator 64 to update the signature held in the signature storage 65. However, in other embodiments, error detection code generated for the message data bits may be used to update the signature held in the signature storage 65. Using the error detection code bits to update the signature may provide for lower overheads, since the error detection code would typically comprise fewer bits than the message data, and therefore, the number of bits used to update the signature and the size of the signature is minimised. It is sufficient to use the error detection code bits for this purpose, since any error occurring in the message data bits that could not be detected by checking the message data against the error detection code bits, would necessarily be reflected in erroneous error detection code bits. For example, an error occurring due to ionising radiation changing the value of a bit in the execution unit, would be reflected in the error detection code bits that are generated by the memory controller 61 when the erroneous one or more data bits output from the execution unit are written to memory 11.

Reference is made to FIG. 6B, which illustrates an embodiment in which the error detection code is used to update the signature. In this case, the memory controller 61 implements the error detection algorithm. In doing so, the memory controller 61 generates error detection code bits for the data (referred to as message data) received in a write to be written to the memory 11. The memory 11 causes the message data received in a write to be written to the memory 11 with the generated error detection code. When reading out the message data from the memory 11, the memory controller 61 also reads out the corresponding error detection code for that message data. The memory controller 61 checks that the message data is as expected given the error detection code and, therefore, that no errors have occurred. In embodiments in which the error detection code is also an error correction code (ECC), and if an error has occurred, the memory controller 61 may correct this error, provided that a sufficient amount of ECC is available given the number of bits subject to the error.

The memory controller 61 generates from the message data in the write 62, two codewords 63a, 63b. Each of these codewords 63a, 63b comprises a set of message data and error detection code for that set of message data. The message data from the write 62 is split between codeword 63a, which contains half of the message data (shown as message data 1) from the write 62, and codeword 63b, which contains the other half of the message data (shown as message data 2) from the write 62. The memory controller 61 calculates a first error detection code (shown as ECC 1) over the message data 1 and combines this with message data 1 to form codeword 63a. The memory controller 61 calculates a second error detection code (shown as ECC 2) over the message data 2 and combines this with message data 2 to form codeword 63b. In some embodiments, the first and the second error detection code each comprises 7 bits of error detection code. Although in FIG. 6B, the error detection code is labelled as ECC, which stands for "Error Correction Code", in some embodiments the error detection code may not be capable of correcting errors.

The memory controller 61 writes both of the codewords 63a, 63b to consecutive memory locations in memory 11 starting from the address indicating in the write 62.

The memory controller 61 causes the error detection code bits (ECC 1 and ECC 2 in the example) to be provided to a signature generator 64. The signature generator 64 operates to update a signature held in signature storage 65 using the error detection code bits it receives from the memory controller 61. The signature generator 64 produces updated signature bits by applying bitwise operations between each bit of the error detection code bits generated for a write and a bit of the current signature (which is held in signature storage 65). The signature generator 64, having generated the updated signature bits causes these to be stored in signature storage 65, overwriting the corresponding bits of the signature previously held in the signature storage 65.

Figure 7:
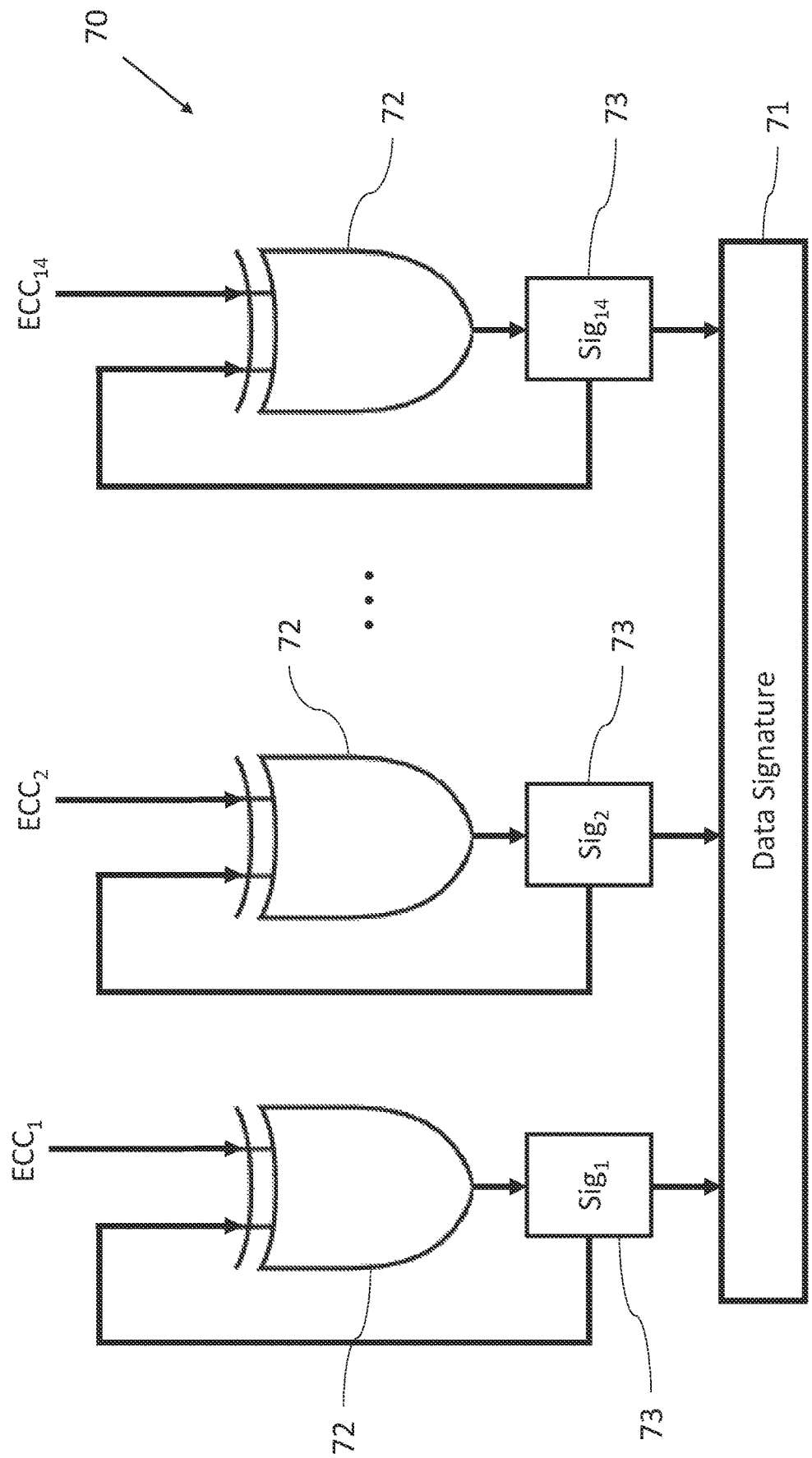
FIG. 7 illustrates an example of circuitry for updating the signature using error detection code.

Reference is made to FIG. 7, which illustrates an example of circuitry 70 that may be used to update bits of the signature using error detection code bits. FIG. 7 shows a storage 71 for storing these bits that are updated in response to each write to memory 11. The storage 71 is part of the signature storage 65. The circuitry 70 includes a plurality of XOR gates 72, which are part of the signature generator 64, for generating bits of the signature. The circuitry 70 includes a plurality of flip flops 73, which are part of the signature generator 64, for holding the signature bits that are output by the XOR gates 72.

To generate a bit of the signature, any one of the XOR gates 72 receives two inputs. As a first input, each XOR gate 72 receives one of the error detection code bits generated from a write. These error detection code bits are labelled $ECC_1$ to $ECC_{14}$ in FIG. 7. As a second input, each XOR gate 72 receives a bit of the signature generated by that XOR gate 72 in response to the previous receipt of an error detection code bit at that XOR gate 72. This bit of the signature represents a value of the current signature held in storage 65. The bit is held in the flip flop 73 corresponding to the XOR gate 72, which outputs its value to one of the inputs of its corresponding XOR gate 72. The signature bits held in the flip flops 73 are labelled $Sig_1$ to $Sig_{14}$ in FIG. 7.

In response to receiving one of the bits of error detection code and one of the bits of the signature from its corresponding flip flop 73, each XOR gate 72 outputs an updated value for its corresponding bit of the signature. This updated value overwrites the previous value of its corresponding bit of the signature held in the associated flip flop 73.

Each flip flop 73 outputs its bit of the signature to a location in the storage 71. When the value held in each flip flop 73 is updated in response to receipt at the signature generator 64 of a new set of error detection code bits, the updated values in the flip flops 73 are output to storage 71 so as to cause the current values of the corresponding bits of the signature held in storage 71 to be updated. In this way, the previous values of the signature held in storage 71 are overwritten with new values of the signature in response to a write to memory 11.

Figure 8:
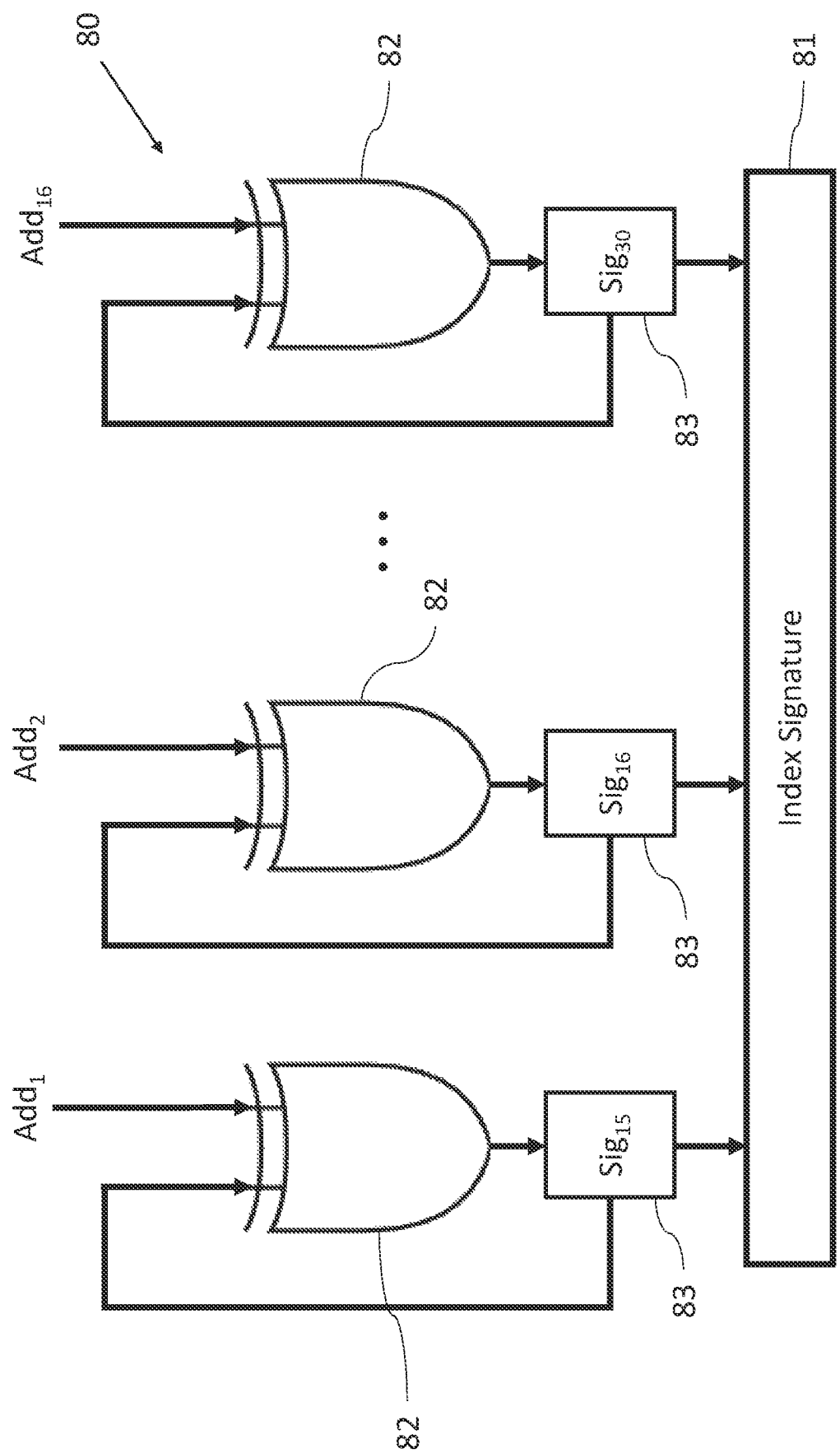
FIG. 8 illustrates an example of circuitry for updating the signature using an address for a write to memory.

Reference is FIG. 8, which illustrates an example circuit 80 that may be used to update bits of the signature using address bits. FIG. 8 shows a storage 81 for storing these signature bits that are updated in response to each write to memory 11. The storage 81 is part of the signature storage 65, and stores the index signature part of the signature. The circuitry 80 includes a plurality of XOR gates 82, which are part of the signature generator 64, for generating bits of the index signature. The circuitry 80 includes a plurality of flip flops 83, which are part of the signature generator 64, for holding the signature bits that are output by the XOR gates 82.

To generate a bit of the signature, each XOR gate 82 receives two inputs. As a first input, each XOR gate 82 receives one of the address bits for a write. These address bits are labelled $Add_1$ to $Add_{16}$ in FIG. 8. As a second input, each XOR gate 82 receives a bit of the signature generated by that XOR gate 82 in response to the previous receipt of an address bit at that XOR gate 82. This bit of the signature represents a value of the current signature held in storage 65. The bit is held in the flip flop 83 corresponding to the XOR gate 82, and that flip flop 83 outputs the bit to be provided to its corresponding XOR gate 82 as the second input for that XOR gate 82. The signature bits held in the flip flops 83 are labelled $Sig_{15}$ to $Sig_{30}$ in FIG. 8.

In response to receiving one of the bits of address and one of the bits of the signature from its corresponding flip flop 83, each XOR gate 82 outputs an updated value for its corresponding bit of the signature. This updated value overwrites the previous value of its corresponding bit of the signature held in the associated flip flop 83.

Each flip flop 83 outputs its held bit of the signature to a location in the storage 81. When the value held in each flip flop 82 is updated in response to receipt at the signature generator 64 of a new set of error detection code bits, the updated values in the flip flops 83 are output to storage 81 so as to cause the current values of the corresponding bits of the signature held in storage 81 to be updated. In this way, the previous values of the index signature held in storage 81 are overwritten with new values of the signature in response to a write to memory 11.

In the embodiments illustrated in FIGS. 7 and 8, the data signature is 14 bits in length, with one bit of data signature per bit of error detection code generated for a write. The index signature is 16 bits, with one bit of index signature per bit of the address for a write.

In the embodiments described above with respect to FIGS. 3 to 5, the update of the signature is performed with respect to all of the writes to a single memory 11 of the tile 4. However, in some embodiments, the tile 4 may be comprise a plurality of memory banks with a separate signature being maintained for each of the memory banks. In this case, the processes described above with respect to FIGS. 3 to 5 as being performed with respect to memory 11 are independently performed for each of the memory banks in the tile 4.

In some embodiments where a separate signature is maintained for each memory bank, circuitry may be provided in the tile 4 for combining the separate signatures in order to form a combined signature for the entire tile 4. This reduces the number of bits for the tile signature, hence reducing the overhead associated with exporting signatures and performing comparisons of signatures between two machines.

Figure 9:
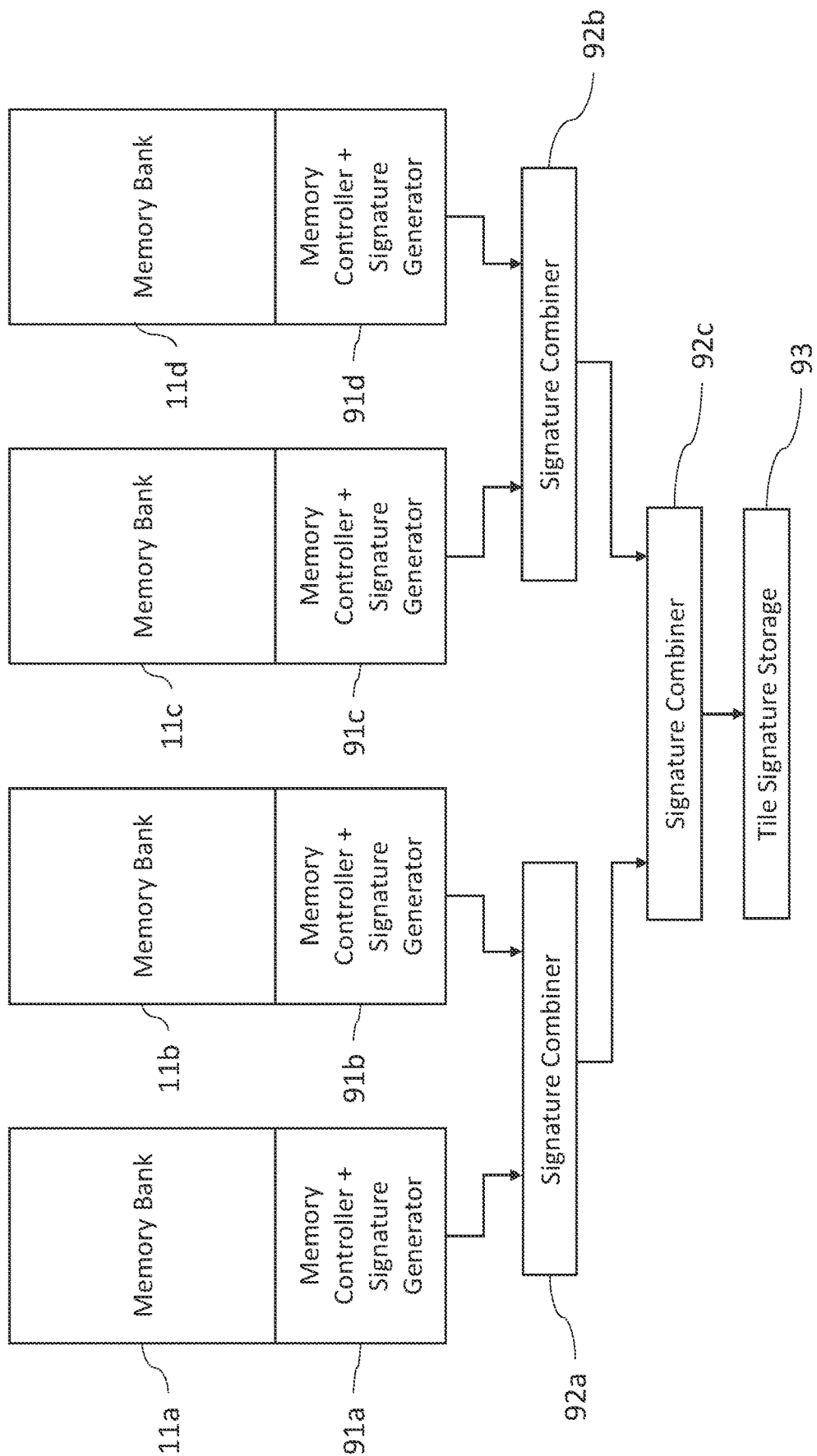
FIG. 9 illustrates an example of circuitry for producing a signature for multiple memory banks.

Reference is made to FIG. 9, which illustrates a plurality of memory banks 11a-11d of the tile 4. Each of the memory banks 11a-11d may be part of the memory 11 described above with respect to FIGS. 2 and 3. Each of the memory banks 11a-11d is associated with an instance 91a-91d of the memory controller 61 and signature generator 65 described above. Each such instance 91a-91d is configured to perform the operations described with respect to FIG. 6 to maintain a signature its associated memory bank 11a-11d. Each instance 91a-91d updates the signature for its memory bank 11a-11d in response to a write to that memory bank 11a-11d. Each maintained signature is stored in an instance of a signature storage 65 (not shown in FIG. 9) associated with the corresponding memory bank 11a-11d.

A plurality of signature combiners 92a-92c are shown in FIG. 9 for producing, from the individual signatures maintained for each memory bank 11a-11d, a signature for the tile 4, with this signature being held in storage 93. In the example, a first signature combiner 92a receives the signature generated for memory bank 11a and the signature generated for memory bank 11b and performs bitwise operations between these two signatures to produce an output. The output has the same number of bits (e.g. 30) as each of the signatures that are used as inputs to the signature combiner 92a. Also shown in the example is a second signature combiner 92b, which receives the signature generated for memory bank 11c and the signature generated for memory bank 11d and performs bitwise operations between these two signatures to produce an output. The output has the same number of bits (e.g. 30) as each of the signatures that are used as inputs to the signature combiner 92b. A third signature combiner 92c receives the outputs of the signature combiners 92a-92b and performs bitwise operations using these outputs to generate the tile signature, which is stored in tile signature storage 93. The tile signature has the same number of bits (e.g. 30) as the signatures generated from each of the memory banks 11a-11d.

Figure 10:
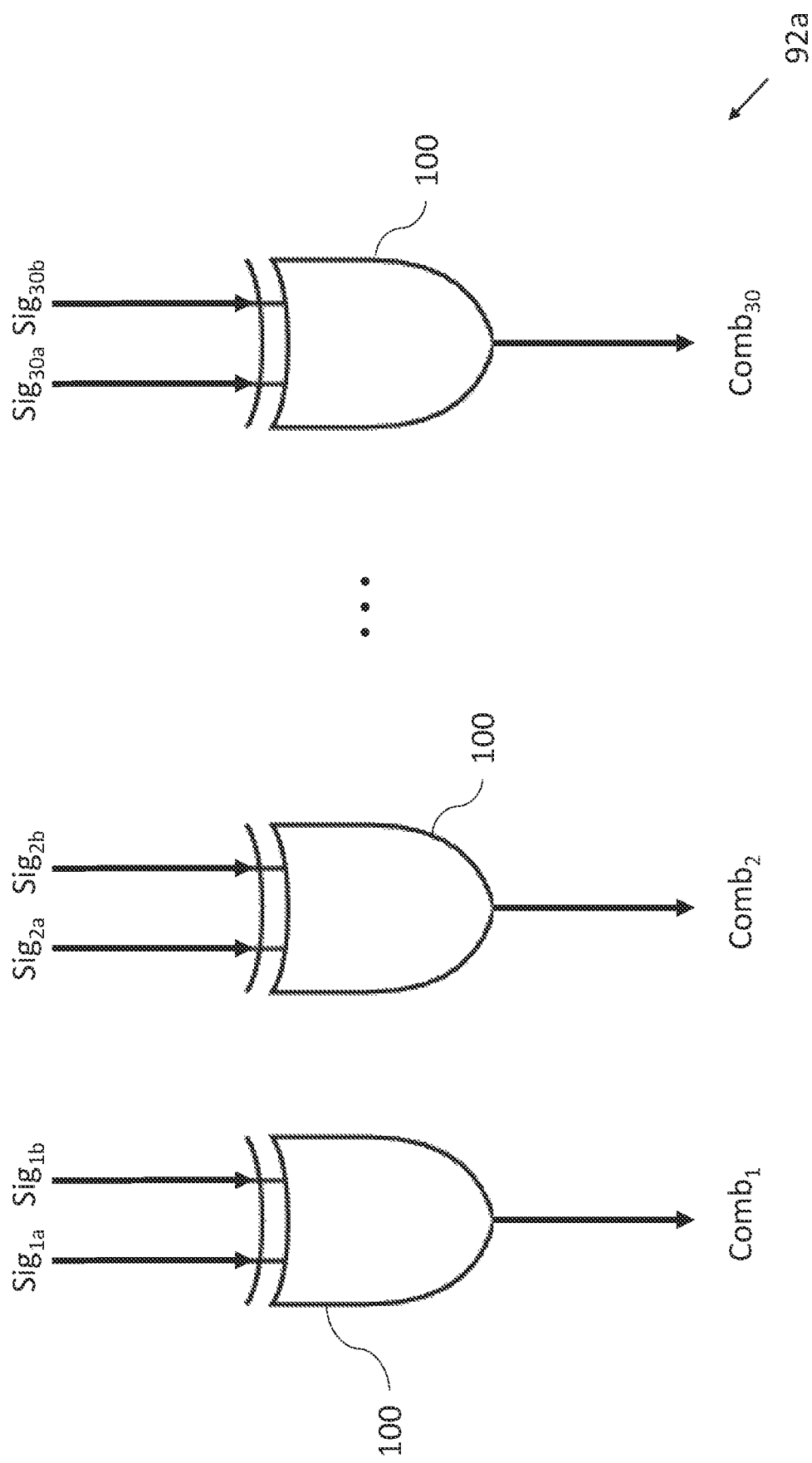
FIG. 10 illustrates an example of circuitry for combining signatures for different memory banks.

Reference is made to FIG. 10, which illustrates an example of the signature combiner 92a. The signature combiner 92a comprises a plurality of XOR gates 100, which are each configured to receive one bit of the signature for one memory bank 11a and another bit of the signature for another memory bank 11b. The bits of signature for memory bank 11a are labelled in FIG. 10 as $Sig_{1a}$ to $Sig_{30a}$, whereas the bits of signature for memory bank 11b are labelled in FIG. 10 as $Sig_{1b}$ to $Sig_{30b}$. Each XOR gate 100 receives corresponding bits of these two signatures and generates a bit of the output from the signature combiner 92a. The bits of the output are shown in FIG. 10 as $comb_s$ to $comb_{30}$.

The same operations illustrated in FIG. 10 as being performed by signature combiner 92a are also performed by signature combiner 92b with respect to the signatures for memory bank 11c and memory bank 11d. Signature combiner 92c may comprise a plurality of XOR gates, which are configured to perform bitwise operations to combine each bit output by signature combiner 92a with a corresponding bit output by signature combiner 92b.

The result from signature combiner 92c is stored in tile signature storage 93, and constitutes the signature for the tile 4. In example embodiments, each signature for one of the memory banks 11a-11d may be 30 bits in length, yielding 120 bits across the tile 4. The tile signature resulting from the signature combination operations may be 30 bits in length.

FIGS. 9 and 10 relate to example in which the signatures generated for different memory banks 11a-11d are combined into a smaller signature for the tile 4. However, in other embodiments, the signatures generated for each of the memory banks 11a-11d may collectively form the signature for the entire tile 4. In this case, the signature for the entire tile 4 may comprise 120 bits.

During the running of the program, each tile 4 is configured to repeatedly exports its signature to an external device. This external device could be a host system. The external device receives signatures from both of the machines running the duplicate applications and compares these signatures. If the signatures match, an indication of the match is provided to all of the tiles 4 in both of the machines. In response to the indication, each tile 4 may exports its current state (including the application data held in its memory 11) to a storage. This state forms checkpoint data for a checkpoint. The tiles 4 of a machine will, at a later time, reload the checkpoint data if an error is detected. If the external device finds that the signatures do not match, then each tile 4 is configured to reload the checkpoint data for the last checkpoint and continue processing from the last checkpoint.

Figure 11:
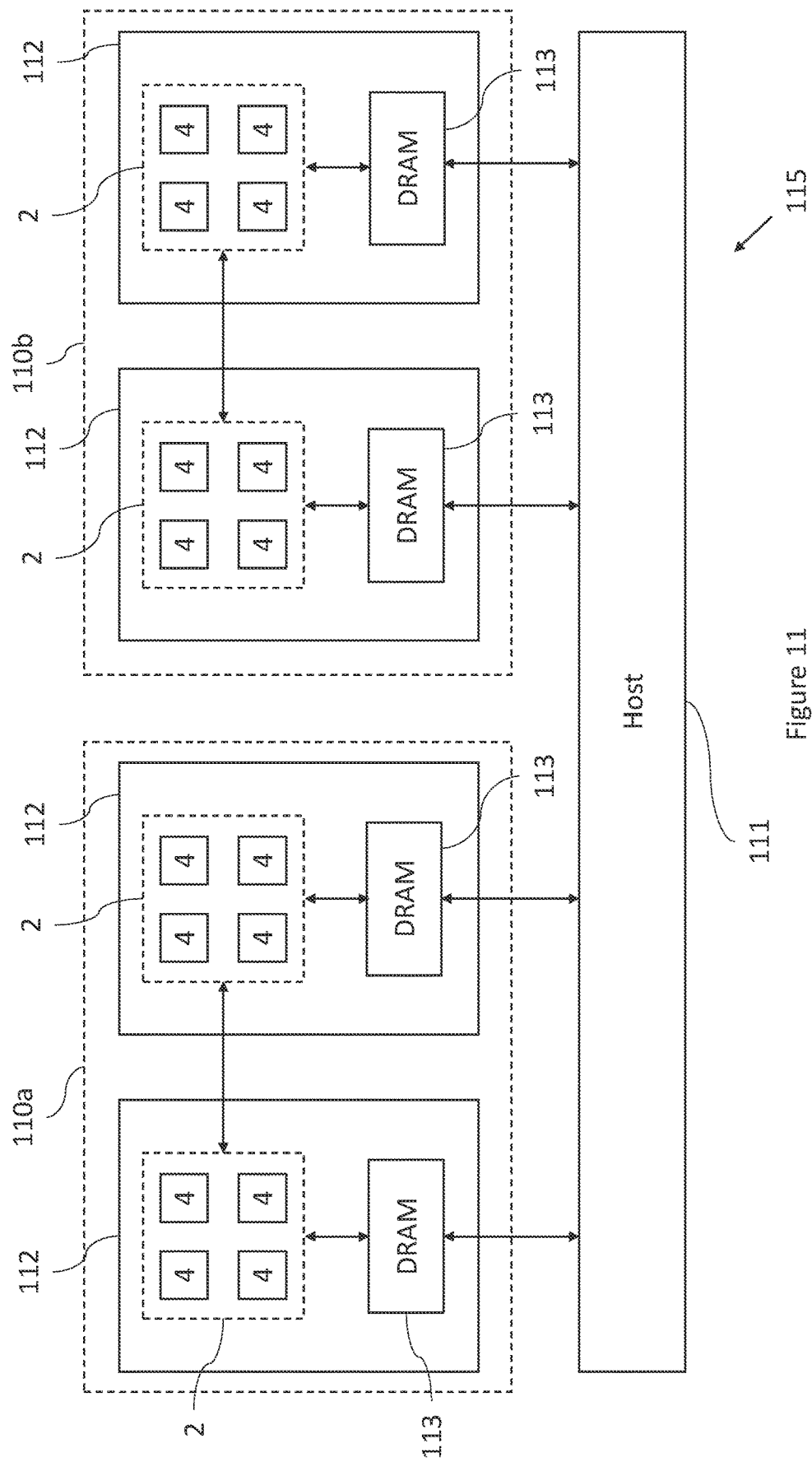
FIG. 11 illustrates an example of a system comprising multiple machines, each configured to run a copy of the same application.

Reference is made to FIG. 11, which illustrates an example of a system 115 comprising two machines 110a, 110b and an external device 111. Each of the machines 110a, 110b constitutes a data processing system 110a, 110b. Both of the machines 110a, 110b run the same application on the same application data. In the example, each machine 110a, 110b comprises a plurality of processing devices 112. Each of the plurality of processing devices 112 may be an integrated circuit (i.e. chip). Each of the processing devices 112 comprises a processing unit 2 comprising a plurality of tile processors 4. Each processing device 112 may also comprise a memory (e.g. DRAM) 113 for storing signatures and/or checkpoint data exported by the tiles 4 of its processing unit 2.

Both of the machines 110a, 110b interface with an external device, which in this example, is a host system 111. The host system 111 performs a comparison of signatures exported by the tiles 4.

The compiled code, which forms the application instructions executing on each of the machines 110a, 110b, includes a set of predefined points during execution of the application at which signature data is to be exported. These predefined form barriers in execution of the application beyond which computation will not proceed until the signature check has passed. At least some of the predefined points may also be checkpoints, in which case, in response to a match of the signatures, the tiles 4 export checkpoint data to form a new checkpoint. This process is described in more detail below.

During execution of the application on machine 110a, each tile 4 performs computations according to a subset of the compiled code for the application that has been allocated to that tile 4. Whilst performing these computations, data is read from and written to memory 11 in each tile 4, resulting in updates to the signature held in the signature storage 65 of the tile 4. When it reaches a predefined point in its compiled code, the execution unit on each tile causes the tile's signature to be exported to external storage. In some embodiments, each tile 4 may write its signature directly to the host 111. In other embodiments, each tile 4 may write its signature to memory 113 of its processing device 112, with the signatures of the tiles 4 of the processing device 112 subsequently being transferred from the memory 113 to the host 111. The result, in either case, is that the host 111 receives the signatures from all of the tiles 4 of the machine 110a.

The same processes performed by machine 110a to export its signatures to the host 111 at the predefined points are also performed by the machine 110b to export its signatures to the host 111. The result is that the host 111 stores the signatures from all of the tiles 4 of machine 110a and the signatures from all of the tiles 4 of the machine 110b. These signatures are expected to match unless an error has taken place during application execution on either or both of the machines 110a, 110b.

The host 111 compares the signatures from the tiles 4 of machine 110a to the corresponding signatures from the tiles 4 of machine 110b. If the signatures match, an indication of the match is provided from the host 111 to each of the tiles 4 of the machines 110a, 110b. Each of the tiles 4, in response to receipt of the indication of the match, continues with the computations in its compiled code set. Each of the tiles 4 may also, prior to continuing with the computations, export checkpoint data to form a new checkpoint. The checkpoint data comprises the data required to restart the application given a detected error. The checkpoint data includes the application data on which the application instructions are executed. The checkpoint data includes the state of the registers 26 in the tiles 4. The checkpoint data may be exported by each tile 4 to the host 111 or may be exported to memory 113 of the processing device 112 to which the respective tile 4 belongs. Exporting the checkpoint data may comprise overwriting checkpoint data corresponding to a previous checkpoint. Once the tiles 4 of a machine 110a, 110b have exported their checkpoint data, that machine 110a, 110b then continues with the execution of the application past the checkpoint. Each machine 110a, 110b will continue with its computation until reaching the next predefined point in the compiled code sets executed on the tiles 4 at which a signature check is again performed. At this point the signatures are again exported from the tiles 4, and a check performed to determine whether the checkpoint data of the most recent checkpoint should be reloaded.

If the host 111 determines that the signatures do not match, an indication of the failure to match is provided from the host 111 to each of the tiles 4 of the machines 110a, 110b. Each of the tiles 4, in response to receipt of this indication, issues read requests to read checkpoint data corresponding to a previous checkpoint from storage (either from the memory 113 of its processing device 112 or from the host 111). This checkpoint data was written by the tiles 4 at the previous checkpoint in the compiled code running on the tiles 4.

Therefore, the tiles 4 are configured to export their signatures in response to reaching predefined barriers in their compiled code, beyond which the computations scheduled to be performed by a tile 4 may not proceed until the signature check has been performed and has passed. The barriers may be barrier synchronisations, discussed above with respect to FIGS. 3 to 5. Such barrier synchronisations are imposed between all of the tiles 4 data of a machine 110a. For example, in response to the tiles 4 of machine 110a reaching a barrier synchronisation imposed for a synchronisation group comprising all of tiles 4 of the machine 110a, the tiles 4 may export a signature and either i) continue with their computations past the predefined point (and, optionally, export checkpoint data) if the signature check passes or ii) load checkpoint data for a last checkpoint if the signature check fails.

Figure 12:
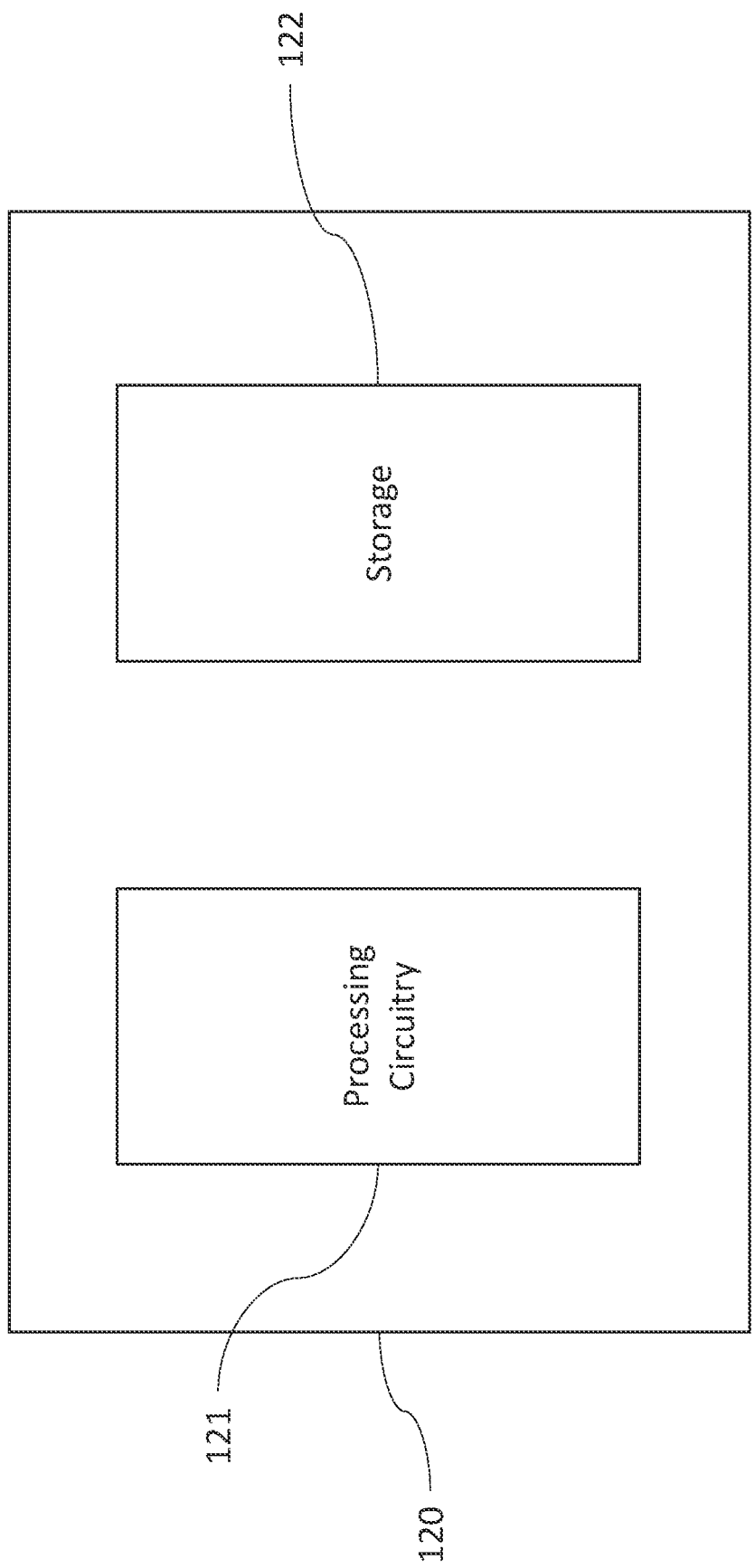
FIG. 12 illustrates an example of processing apparatus, which may be used to implement multiple different components described.

Reference is made to FIG. 12, which illustrates an example of a processing device 120 that may be used to implement various components described above. The memory controller 61 may be implemented comprise such a processing device 120 for performing the operations described. The host 111 may comprise such a processing device 120 for performing the operations described with respect to FIG. 12. The signature 64 may comprise such a processing device 120 for performing the operations described with respect to FIG. 12.

The processing device 120 comprises processing circuitry 121 and storage 122. The processing circuitry 121 may comprises circuitry, e.g. a field programmable gate array (FPGA) or application specific integrated circuit (ASIC), for implementing one or more functions in hardware. The processing circuitry 121 may comprise a processor for executing computer readable instruction for performing one or more functions in software. The storage 122 may comprise data to be processed by the processing circuitry 121 and/or results of processing by the processing circuitry 121. The storage 122 may comprise computer readable instructions for execution by a processor of the processing circuitry 121.

It will be appreciated that the above embodiments have been described by way of example only. In particular embodiments have been described in terms of a multi-tile processing unit 2. However, some embodiments may be implemented in a processing unit having only a single processor, with this single processor having the features described, with respect to FIGS. 6 to 12, as being possessed by the tile processor 4. Furthermore, although with respect to FIG. 11, it is described that each machine 110a, 110b running a duplicate copy of the application comprises a plurality of devices 112, in some embodiments each machine may comprise only a single device 112, which is configured to run the entire application.

Figure 13:
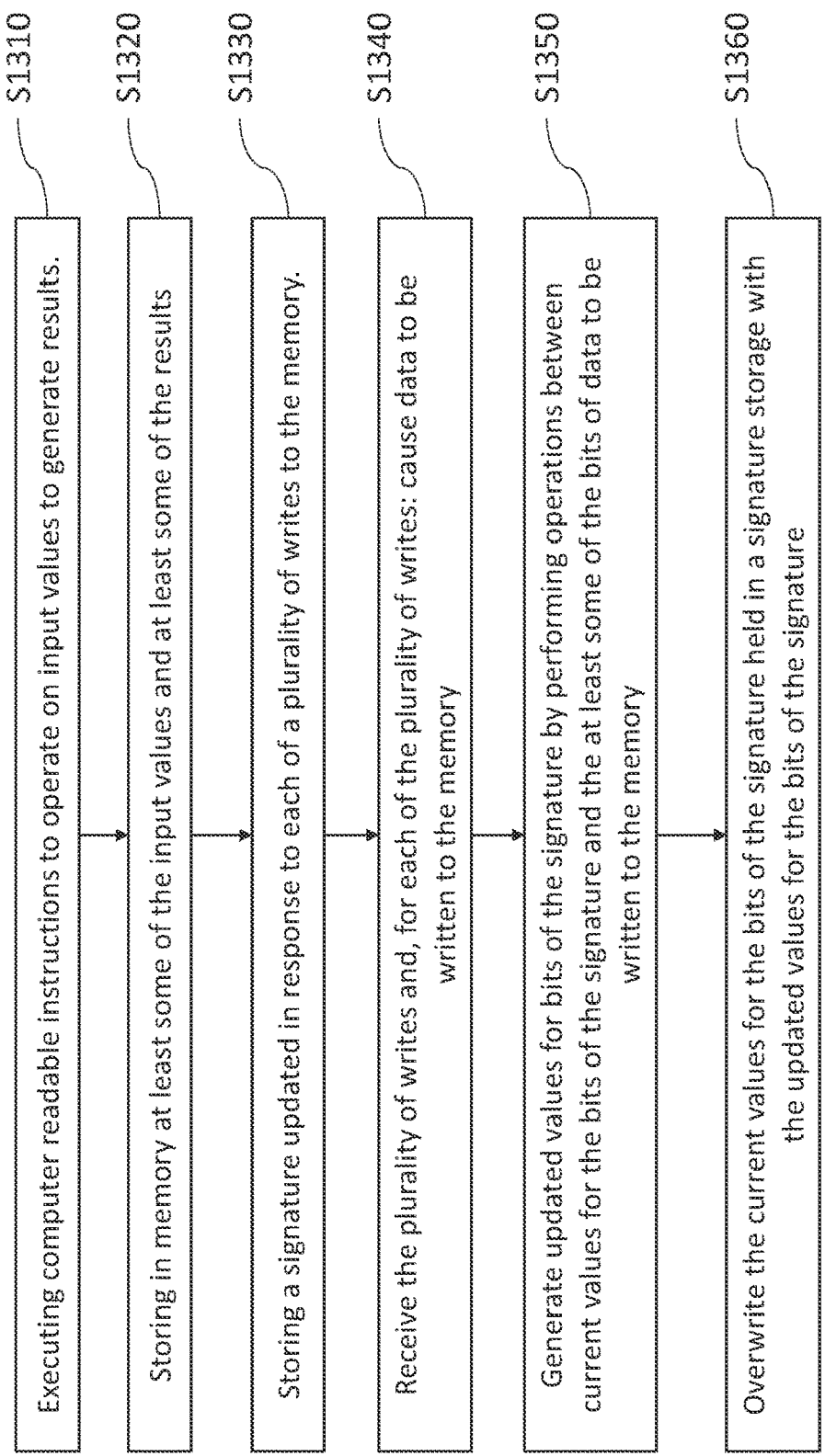
FIG. 13 illustrates an example of a method according to embodiments of the application.

Reference is made to FIG. 13, which illustrates a method 1300 according to embodiments of the application.

At S1310, the execution unit 18 executes computer readable instructions to operate on input values to generate results.

At S1320, the memory 11 stores at least some of the input values and at least some of the results.

At S1330, the signature storage 65 stores a signature updated in response to each of a plurality of writes to the memory 11.

At S1340, for each of the plurality of writes, the memory controller 61 causes data to be written to the memory 11.

At S1350, for each of the plurality of writes, the signature generation circuitry 64 generates updated values for bits of the signature by performing operations between current values for the bits of the signature and the at least some of the bits of data to be written to the memory 11.

At S1360, for each of the plurality of writes, the signature generation circuitry 64 overwrites the current values for the bits of the signature held in the signature storage 65 with the updated values for the bits of the signature.

The above embodiments have been described by way of example only.

The invention claimed is:

1. A data processing system comprising:
a first data processing device that includes:
a memory;
signature generation circuitry;
a signature storage configured to store a signature updated by the signature generation circuitry in response to each of a plurality of writes to the memory; and
processing circuitry configured to receive the plurality of writes and, for a first write of the plurality of writes, cause data to be written to the memory at an address indicated by address bits for the first write, wherein the signature generation circuitry is configured to:
generate updated values for bits of the signature by performing operations between current values for the bits of the signature and the address bits for the first write; and
overwrite the current values for the bits of the signature held in the signature storage with the updated values for the bits of the signature,
wherein a result for the signature after the plurality of writes is independent of an order of the writes, and
wherein the signature generation circuitry is further configured to, for each of the plurality of writes:
perform further operations to update further bits of the signature using at least some bits of the data to be written to the memory.

2. The data processing system of claim 1, wherein at least some of the writes are received at the first data processing device from a second data processing device.

3. The data processing system of claim 1, wherein the first data processing device comprises an execution unit configured to:
generate at least some of the writes.

4. The data processing system of claim 1, wherein the plurality of writes comprise at least one item selected from a list consisting of:
a plurality of write requests; and
a plurality of read completions.

5. The data processing system of claim 1, wherein the operations are bitwise operations between the address bits for the first write and the current values for the bits of the signature.

6. The data processing system of claim 5, wherein each of the bitwise operations comprises a XOR operation between one of the address bits and one of the current values for the bits of the signature.

7. The data processing system of claim 1, wherein the at least some bits of the data comprises a set of error detection code bits generated for the first write by the processing circuitry.

8. The data processing system of claim 1, wherein the further operations include bitwise operations.

9. The data processing system of claim 8, wherein each of the bitwise operations comprises a XOR operation between one of the bits of the data for the first write and a current one of the further bits of the signature.

10. The data processing system of claim 1, wherein the memory comprises a plurality of memory banks, wherein the signature generation circuitry is further configured to, for a first memory bank of the plurality of memory banks:
update a first part of the signature that is associated with the first memory bank in response to ones of the plurality of writes that are made to the first memory bank, including using at least some of the bits of the data to be written to the first memory bank for the ones of the plurality of writes to the first memory bank to update the first part of the signature associated with the first memory bank.

11. The data processing system of claim 10, wherein the first data processing device comprises:
signature combiner circuitry configured to generate a combined signature by combining the first part of the signature with other parts of the signature associated with others of the memory banks, the combined signature for the first data processing device having fewer bits than a total number of bits of the first part of the signature and the other parts of the signature.

12. The data processing system of claim 1, wherein the first data processing device comprises a memory controller comprising the processing circuitry.

13. A data processing system comprising:
a first data processing device that includes:
a memory;
signature generation circuitry;
a signature storage configured to store a signature updated by the signature generation circuitry in response to each of a plurality of writes to the memory; and
processing circuitry configured to receive the plurality of writes and, for a first write of the plurality of writes, cause data to be written to the memory at an address indicated by address bits for the first write,
wherein the signature generation circuitry is configured to:
generate updated values for bits of the signature by performing operations between current values for the bits of the signature and the address bits for the first write; and
overwrite the current values for the bits of the signature held in the signature storage with the updated values for the bits of the signature,
wherein a result for the signature after the plurality of writes is independent of an order of the writes;
a first data processing machine comprising the first data processing device;
a second data processing machine comprising a second data processing device; and
a further device configured to interface with both the first data processing machine and the second data processing machine,
wherein the first data processing machine and the second data processing machine are configured to run duplicates of an application such that the data written to the memory of the first data processing device by the plurality of writes is also written to a memory of the second data processing device,
wherein the second data processing device is configured to generate a further signature by performing a same set of steps as performed by the first data processing device to generate the signature,
wherein the further device is configured to:
compare the signature and the further signature to determine that an error has occurred on either or both of the first data processing machine and the second data processing machine.

14. The data processing system of claim 13, wherein the first data processing machine comprises a plurality of instances of the first data processing device, and the second data processing machine comprises a plurality of instances of the second data processing device,
wherein the further device is configured to compare a first plurality of signatures generated by the plurality of instances of the first data processing device with a second plurality of signatures generated by the plurality of instances of the second data processing device.

15. The data processing system of claim 1, wherein the first data processing device is a tile of a multi-tile processing unit.

* * * * *